(12) United States Patent
Morelle et al.

(10) Patent No.: US 8,952,288 B2
(45) Date of Patent: Feb. 10, 2015

(54) METHOD OF BONDING A MEMBER TO A SUPPORT BY ADDITION OF MATERIAL, AND DEVICE FOR ARRANGING TWO ELEMENTS, ONE ON THE OTHER

(71) Applicant: Valeo Electronique et Systemes de Liaison, Newton (FR)

(72) Inventors: Jean-Michel Morelle, Beaugency (FR); Laurent Vivet, Bois d'Arcy (FR); Mathieu Medina, Pessac (FR); Sandra Dimelli, Bois d'Arcy (FR)

(73) Assignee: Valeo Equipements Electriques Monteur, Créteil (FR)

( * ) Notice: Subject to any disclaimer, the term of this patent is extended or adjusted under 35 U.S.C. 154(b) by 145 days.

(21) Appl. No.: 13/672,400

(22) Filed: Nov. 8, 2012

(65) Prior Publication Data

US 2013/0062326 A1     Mar. 14, 2013

Related U.S. Application Data

(63) Continuation of application No. 12/310,907, filed as application No. PCT/FR2007/051904 on Sep. 11, 2007, now abandoned.

(30) Foreign Application Priority Data

Sep. 14, 2006    (FR) ...................................... 06 53731

(51) Int. Cl.
*B23K 26/00* (2014.01)
*B23K 1/20* (2006.01)
(Continued)

(52) U.S. Cl.
CPC .................. *B23K 1/20* (2013.01); *B23K 1/0056* (2013.01); *B23K 37/0408* (2013.01); *H05K 3/341* (2013.01); *H05K 3/3478* (2013.01);
(Continued)

(58) Field of Classification Search
None
See application file for complete search history.

(56) References Cited

U.S. PATENT DOCUMENTS 5,285,946 A    2/1994  Tomigashi et al.
5,615,012 A    3/1997  Kazem-Goudarzi et al.
(Continued)

FOREIGN PATENT DOCUMENTS

JP    A-64-020630    1/1989
JP    U-64-20630     2/1989
(Continued)

OTHER PUBLICATIONS

Japanese Office Action for Application No. 2012-021293 mailed Sep. 17, 2013 (with English Translation).

*Primary Examiner* — Benjamin Sandvik
(74) *Attorney, Agent, or Firm* — Oliff PLC (57) ABSTRACT

A method having a step of heating a mass forming a braze. Before the heating step, the method includes steps of arranging the mass and the member on the support. In particular, it includes a step of positioning the mass on the support and a step of applying a first compressive force on the mass so as to compress said mass against the support, the intensity of the first force increasing up to a predetermined first value chosen so as to flatten the mass. Next, the method includes a step of positioning the member on the flattened mass and a step of applying a second compressive force to the member so as to compress said member against the flattened mass and the support, the intensity of the second force increasing up to a second predefined value, the second predefined value being lower than the first predefined value.

11 Claims, 2 Drawing Sheets

(51) Int. Cl.
  *B23K 1/005* (2006.01)
  *B23K 37/04* (2006.01)
  *H05K 3/34* (2006.01)
  *B23K 3/08* (2006.01)
  *B23K 26/20* (2014.01)
  *H01L 23/00* (2006.01)

(52) U.S. Cl.
  CPC .................. *B23K 3/08* (2013.01); *B23K 26/20* (2013.01); *H01L 24/75* (2013.01); *B23K 2201/40* (2013.01); *H05K 3/3484* (2013.01); *H05K 2203/0195* (2013.01); *H05K 2203/0278* (2013.01); *H05K 2203/0415* (2013.01); *H05K 2203/082* (2013.01); *H05K 2203/107* (2013.01); *H05K 2203/163* (2013.01)
  USPC .................................................... 219/121.64

(56) References Cited

U.S. PATENT DOCUMENTS

| | | |
|---|---|---|
| 5,673,844 A | 10/1997 | Sargent |
| 6,131,795 A | 10/2000 | Sato |
| 6,270,898 B1 | 8/2001 | Yamamoto et al. |
| 6,353,202 B1 | 3/2002 | Grotsch et al. |
| 6,471,110 B1 | 10/2002 | Luechinger et al. |
| 6,666,368 B2 * | 12/2003 | Rinne ........................ 228/180.22 |
| 2003/0140678 A1 | 7/2003 | Siegel et al. |
| 2004/0011856 A1 | 1/2004 | Wolf et al. |
| 2005/0098610 A1 * | 5/2005 | Onobori et al. .......... 228/180.21 |
| 2005/0241143 A1 | 11/2005 | Mizuno et al. |

FOREIGN PATENT DOCUMENTS

| | | |
|---|---|---|
| JP | A-02-134831 | 5/1990 |
| JP | 5-5388 U | 1/1993 |
| JP | H09-248783 A | 9/1997 |
| JP | 2004-505783 | 2/2004 |
| JP | A-2004-079890 | 3/2004 |
| JP | A-2004-193533 | 7/2004 |
| JP | 2004-303757 A | 10/2004 |
| JP | 2006-324533 A | 11/2006 |
| WO | WO 97/45867 A1 | 12/1997 |
| WO | WO 02/14008 A1 | 2/2002 |
| WO | WO 03/001572 A2 | 1/2003 |

\* cited by examiner

METHOD OF BONDING A MEMBER TO A SUPPORT BY ADDITION OF MATERIAL, AND DEVICE FOR ARRANGING TWO ELEMENTS, ONE ON THE OTHER

CROSS-REFERENCE TO RELATED APPLICATIONS

This is a Continuation of application Ser. No. 12/310,907 filed Dec. 10, 2009 and claims the benefit of International Patent Application No. PCT/FR2007/051904 filed on Sep. 11, 2007 which claims priority to French Patent Application No. 0653731 filed on Sep. 14, 2006. The disclosure of the prior applications is hereby incorporated by reference herein in its entirety.

FIELD OF THE INVENTION

This invention relates to a method for soldering a component to a holder by addition of material and a device for arranging two elements, one on the other.

It applies more particularly to soldering a component such as a semi-conductor chip on a holder.

BACKGROUND OF THE INVENTION

A method for soldering a component on a holder by addition of mass forming solder, of the type comprising a step in which the mass is heated is already known in the state of the art. In a conventional manner, the mass forming solder consists of a soldering paste or a thin strip cut up into discs or rectangles which is inserted between the semi-conductor chip, and the holder. Generally, before the heating step, the component is placed precisely on the mass forming solder in an initial position guaranteeing parallelism between the chip and the holder.

When the mass forming solder is heated to a temperature greater than or equal to the melting point of the solder, the mass melts and on solidifying assembles the chip to the holder. For example, to heat the solder, a laser beam is directed to a first side of the holder opposite a second side of the holder bearing the mass, at the position of this mass, and the heat generated by the impact of the beam on the holder propagates through the holder to the mass.

Generally, the contact surfaces between the mass forming solder and the chip, firstly, and the holder and the mass forming solder, secondly, are relatively irregular making heat transfer from the holder to the chip difficult during the heating step.

Consequently, generally, to improve the heat transfer between the chip and the holder, while positioning the chip before the heating step a compression force is applied on the assembly comprising the chip, the mass forming solder and the holder to remove, as much as possible, the surface irregularities.

The intensity of this compressive force must be relatively low to avoid damaging the semi-conductor chip during compression.

Since the intensity of this compressive force is relatively low, however, some irregularities remain making the heat transfer sometimes insufficient during the heating step.

Consequently, the temperature of the assembly comprising the chip, the mass and the holder is not homogeneous during the heating step and the joint resulting from cooling of the mass forming solder may then exhibit faults, such as in particular non uniform thickness.

OBJECTS AND SUMMARY OF THE INVENTION

The main purpose of the invention is therefore to improve the quality of the joint between the chip and the holder formed by cooling the mass forming solder.

The invention therefore relates to a soldering method of the above-mentioned type, characterised in that before the heating step, it includes the following steps of arranging the mass and the component on the holder:

positioning the mass on the holder, applying a first compressive force on the mass so as to compress the mass against the holder, the intensity of the first force increasing up to a predefined first value chosen so as to flatten the mass forming solder, positioning the component on the flattened mass, and applying a second compressive force to the component so as to compress the component against the flattened mass and the holder, the intensity of the second force increasing up to a second predefined value, the second predefined value being lower than the first predefined value.

Since the first predefined value of the first force is greater than the second predefined value of the second force, the soldering process according to the invention can take into account the different compressive strengths of the chip and the mass forming solder.

The intensity of the first compressive force is for example 50 grams-force and the intensity of the second compressive force is 10 grams-force.

Due to the fact that, firstly, the first compressive force is applied to the mass forming solder without the chip, a relatively high value can be chosen to flatten the mass sufficiently and thereby improve the heat transfer between the holder and the mass.

Second, the second compressive force can then be applied to the component against the flattened mass and the holder, the second predefined value can be chosen relatively low. The chip is therefore protected from damage due to the intensity of the compressive force being too high.

In addition, by applying a second compressive force on the chip, the mass and the holder, the heat transfer is optimised between the holder and the chip.

Preferably, during the step of positioning the mass on the holder, the mass is moved towards the holder until detection of a position where the mass comes into contact with the holder and, during the application step, the intensity of the first force is increased from a substantially zero initial value set during detection of the contact position up to the first predefined value.

Similarly, during the step of positioning the component on the flattened mass, the component is moved towards the flattened mass until detection of a position where the component comes into contact with the flattened mass and, during the application step, the intensity of the second force is increased from a substantially zero initial value set during detection of the contact position up to the second predefined value.

Thus, the steps of detection of a contact position and application of a compressive force of substantially zero initial intensity provide efficient control over compression of the mass against the holder and compression of the chip against the flattened mass and the holder. A soldering method according to the invention may also include one or more of the following characteristics:

the intensity of the first and/or the second compressive force is increased in incrementation steps from the value of the intensity up to the first and/or the second predefined value;

during the heating step, the relative position of the component against the holder is maintained constant;

during the heating step, a laser beam is directed to a first side of the holder opposite a second side of the holder bearing this mass, at the position of this mass, during a period of irradiation of the holder by the beam, and the relative position of the component against the holder is maintained constant, at least during the period of irradiation;

the first predefined value is determined according to a lower critical limit of the mass thickness after the step of applying the first force;

the second predefined value is less than a critical value beyond which the component would be damaged;

the component is a semi-conductor chip.

The invention also relates to a device for arranging a first element on a second element comprising:

means of moving the first element on the second element, means of compressing the first element against the second element, characterised in that it further comprises:

means of detecting a contact position when the first element comes into contact with the second element, means forming counterweight of the displacement means, and means of controlling the compression means and the means forming counterweight according to detection of the contact position.

An arranging device according to the invention may also include one or more of the characteristics according to which:

the displacement means comprise suction type holding means to hold the first element;

the displacement means comprise infrared type temperature measurement means with an optical fibre passing through a suction tube of the holding means;

the detection means are chosen amongst a capacitive type contact detector and a pressure sensor;

the device is designed to arrange a first element chosen amongst a mass forming solder and a semi-conductor chip on a second element forming holder.

BRIEF DESCRIPTION OF THE DRAWINGS

It will be easier to understand the invention on reading the description below, given as an example and referring to the drawings, on which.

DETAILED DESCRIPTION OF THE DRAWINGS

Figure 1:
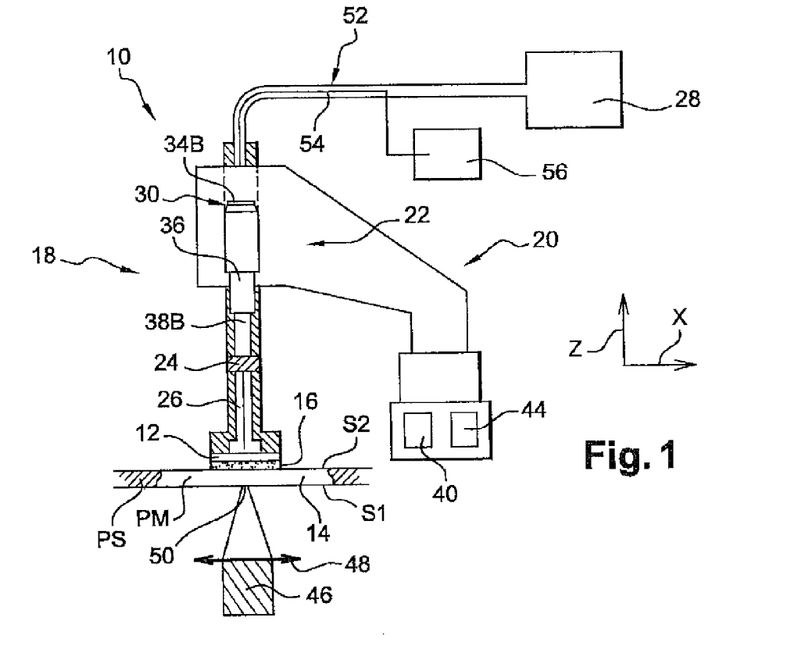
FIG. 1 is a diagram of a soldering installation comprising an arranging device according to the invention.

A soldering installation is represented on FIG. 1. The soldering installation is designated by the general reference 10.

The installation 10 is used to solder a component 12 on a holder 14 by addition of mass forming solder 16.

In the example described, component 12 is a conventional semi-conductor chip. In a conventional manner, the mass forming solder 16 consists of a soldering paste or a thin strip cut up into discs or rectangles.

In the example described, holder 14 comprises a metal part PM, in particular at least partially surrounded by a part PS made of synthetic material forming part of a protective box to protect the semi-conductor chip 12 supported by the holder 14.

The holder 14 comprises first S1 and second S2 opposite sides, the mass forming solder 16 being intended to be attached to the second side S2 of the metal part PM of the holder 14. Preferably, the second side S2 is plated with a thin layer of nickel.

In order to precisely arrange the chip 12 and the mass 16 on the holder 14, the soldering installation 10 also comprises a device 18 for arranging a first element chosen amongst the mass forming solder 16 and the semi-conductor chip 12 on a second element forming holder (such as holder 14).

The arranging device 18 includes means 20 for displacing the chip 12 or the mass 16 on the second element forming holder. In this example, the displacement means 20 includes articulated means 22 for displacement of the chip 12 or of the mass 16 in a horizontal plane substantially parallel to the X and Y axes and in a vertical direction substantially parallel to a Z axis.

Preferably, the displacement means 20 also include holding means 24 to hold the first element 12 or 16.

Preferably, the holding means 24 are suction type. The holding means 24 therefore include a suction tube 26 connected to suction means 28 including for example a vacuum pump. In order to precisely displace the holding means 24, the displacement means 20 comprise connection means 30 to connect the articulated means 22 and the holding means 24, capable of adopting an active state in which the means 24 are fastened to the articulated means 22 and an idle state in which the means 24 are separated from the articulated means 22.

These connection means 30 comprise for example first 32A and second 32B linear actuator arms with horizontal action (in this example, parallel to the y-axis) fastened to the articulated means 22 equipped with first 34A and second 34B clamping jaws (FIGS. 2 to 8). For example, the actuator arms 32 are of type pneumatic linear cylinder with rod. Each jaw 34A, 34B is fastened to one end of the rod of the corresponding cylinder 32A, 32B.

In this example, in the active state of the connection means 30, the clamping jaws 34 are intended to clamp the holding means 24 and in the idle state of the connection means 30, the clamping jaws 34 are intended to release the holding means 24.

The arranging device 18 also comprises compression means 36 to compress the first element against the second element intended to apply a compressive force on the first element against the second element.

The compression means 36 comprise for example first 38A and second 38B linear actuator arms with vertical action (in the example, parallel to the z-axis), fastened to the articulated means 22. The actuator arms 38 are intended to apply a vertical compressive force on the first element against the second element by exerting a vertical thrust on the holding means 24.

Each actuator arm 38 is also of type pneumatic linear cylinder with rod. In a conventional manner, therefore, the actuator arms 38 are intended to adopt an idle state in which the rod of each cylinder is retracted and a working state in which the rod of each cylinder is extended. The holding means 24, fastened to the cylinder rods, are displaced by the cylinder rods such that they are raised when the cylinders of the actuator arms 38 change from an active state to an idle state and lowered otherwise.

In the example described, the device 18 also includes means 40 for adjusting the intensity of the compressive force (shown on FIG. 1).

In addition, the arranging device 18 also comprises means 42 for detecting a contact position when the first element comes into contact with the second element. The detection means 42 preferably comprise a pressure sensor integrated in the holding means 24.

As a variant, the detection means 42 comprise a capacitive type contact detector.

The arranging device 18 also comprises means forming counterweight (not shown) of the displacement means 20. In this example, more precisely, the means form counterweight of the holding means 24 and form an element of the compression means 36, more especially an element of the actuator arms 38.

The arranging device 18 also comprises means 44 for controlling the compression means 36 and means forming counterweight according to detection of the contact position by the means 42.

To heat the mass forming solder 16 to solder the chip 12 on the holder 14, the installation 10 also comprises a heat source (not shown), such as for example a laser source emitting a laser beam 46.

The installation 10 also comprises means 48 for focusing the laser beam 46 at a point 50 at the position of the mass forming solder 16.

Possibly, in order to check the temperature of the mass forming solder 16 and of the semi-conductor chip 12 while heating these two elements, the displacement means 20 comprise infrared type temperature measurement means 52 (FIG. 1).

For example, the measurement means 52 comprise an optical fibre 54 passing through the suction tube 26 of the holding means 24. Possibly, the measurement means 52 also comprise an infrared pyrometer 56 connected to the optical fibre 54.

We will now describe, referring to FIGS. 2 to 8, the main steps of a soldering method according to the invention.

Firstly, this method comprises steps for arranging the component 12 and the mass 16 on the holder 14.

Figures 2, 3:
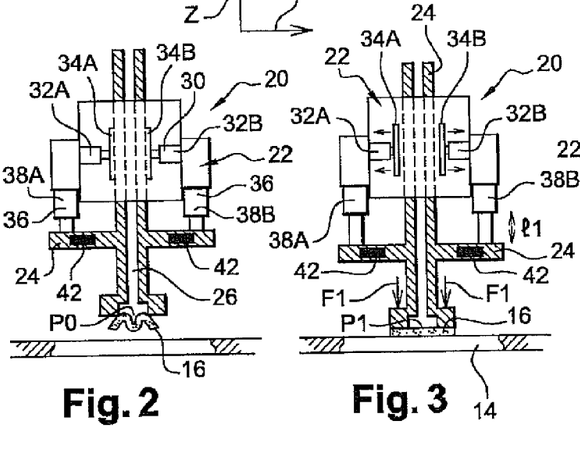
FIGS. 2 to 8 are front views of the arranging device shown on FIG. 1, illustrating various steps of a soldering process to solder a chip on a holder according to the invention.

Thus, during a first arranging step illustrated on FIG. 2, the mass 16 is positioned on the holder 12. As can be seen on FIG. 2, the initial general shape of the mass forming solder 16 is relatively irregular.

During this step, the clamping jaws 34 clamp the holding means 24 such that the holding means 24 are fastened to the articulated means 22. In addition, the actuator arms 38 are in their idle state. Consequently, displacement of the holding means 24 is relatively precise since perfectly controlled by the articulated means 22.

The holding means 24 hold the mass forming solder 16 by suction.

The displacement means 20 then displace the mass 16 horizontally and vertically, relatively quickly, up to a first predefined position P0 with coordinates X0, Y0 and Z0. In this example, the coordinates X0, Y0 are predetermined according to the positions of the electrical connectors on the holder 14 (not shown) intended for electrical connection with the chip 12. The coordinate Z0 is chosen so that the holder 14 and the mass 16 are far enough apart to avoid any accidental contact between these two elements.

The means 20 then progressively displace the mass 16 in the vertical direction Z until detection of a position where the mass 16 comes into contact with the holder 14.

Upon detection of the position where the mass 16 comes into contact with the holder 14, the means 44 control activation of the compression means 36.

Thus, during a second step for arranging the mass 16 on the holder 14, illustrated by FIG. 3, the compression means 36 apply on the mass 16 a first compressive force F1 for compressing the mass 16 against the holder 14 using the holding means 24.

More precisely, during this step, the means 30 for connecting the articulated means 22 and the holding means 24 are in idle state. The holding means 24 are therefore no longer fastened to the articulated means 22.

The actuator arms 38 then exert a vertical thrust along the direction defined by the z-axis on the holding means 24 in order to apply the compressive force F1 on the mass 16 against the holder 14. According to the invention, the compression means 36 increase the intensity of the first force F1 up to a first predefined value, chosen so as to flatten the mass forming solder 16.

Preferably, in order to precisely control the intensity of the compressive force F1, the means 44 also control activation of the means forming counterweight of the holding means 24 on detection of the contact position. Activation of the means forming counterweight therefore cancels out the force of gravity of the holding means 24 exerted on the mass 16.

In this case, on detection of the contact position, the intensity of the first force F1 can be adjusted to an initial value of zero, firstly by adjusting the intensity of the force with the adjustment means 40 and secondly by activating the means forming counterweight.

Thus, during the step when force F1 is applied, the compression means 36 increase the intensity of the first force F1 from the substantially zero initial value, set on detection of the contact position, up to the first predefined value.

Preferably, the intensity of the first compressive force F1 is increased in incrementation steps from the value of the intensity up to the first predefined value.

During the step when force F1 is applied, the holding means 24 descend to a position P1 where the cylinder rods 38 are extended by a length l1 required to reach the first predefined value of the intensity of the compressive force H.

In the example described, the first predefined value is about 50 grams-force. Generally, the initial thickness of the mass forming solder 16, before the step when the compressive force is applied, is about 100 microns.

Preferably, the first predefined value is determined according to the lower critical limit of the mass 16 thickness after the step when the first force F1 is applied.

For example, this lower critical limit of the thickness is defined as being the limiting thickness below which the joint resulting from cooling of the mass 16 is likely to be relatively fragile. In this example, the lower critical limit of the thickness of the mass is about 70 microns.

Figure 4:
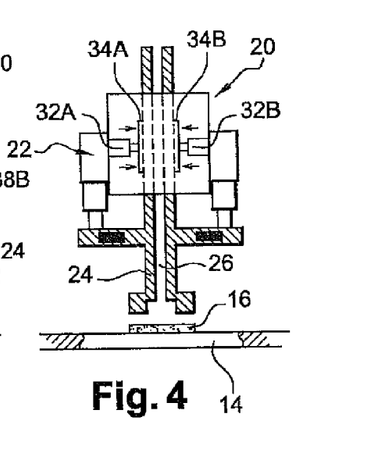

After the mass 16 has been flattened, the suction means 52 are deactivated so that the holding means 24 release the mass 16 (FIG. 4). The actuator arms 38 then switch from their active state to their idle state, allowing the holding means 24 to rise. In addition, the means 30 for connecting the holding means 24 comprising in particular the clamping jaws 34 are activated so that the holding means 24 are once again fastened to the articulated means 22.

Figure 5:
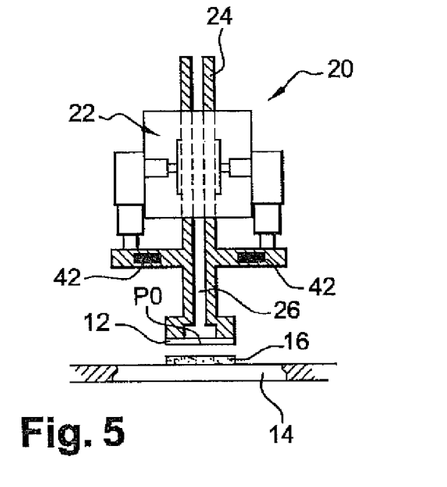

During a third arranging step illustrated on FIG. 5, the semi-conductor chip 12 is positioned on the flattened mass 16.

The displacement means 20 move to pick up the chip 12 by suction.

The displacement means 20 then displace the chip 12 horizontally and vertically, relatively quickly, up to the predefined position P0 with coordinates X0, Y0 and Z0. In this position, the chip 12 is not in contact with the mass 16.

The means 20 progressively displace the chip 12 in the vertical direction Z until detection of a position where the chip 12 comes into contact with the flattened mass 16.

Upon detection of the position where the chip 12 comes into contact with the flattened mass 16, the means 44 control activation of the compression means 36.

Figure 6:
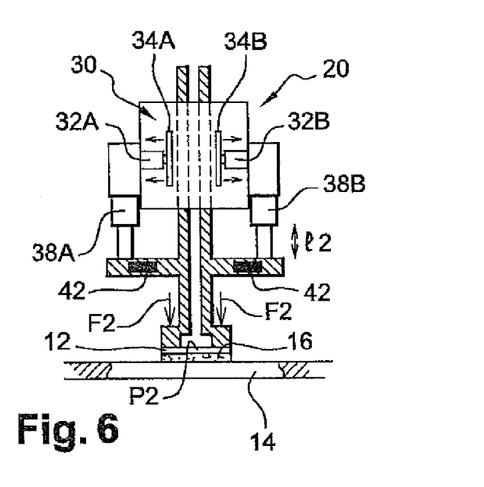

Thus, during a fourth arranging step illustrated on FIG. 6, to reduce the irregularities of the contact surface between the chip 12 and the flattened mass 16, the compression means 36 apply on the chip 12 a second compressive force F2 on the chip 12 against the flattened mass 16 and the holder 14.

According to the invention, the compression means 36 increase the intensity of the second force F2 up to a second predefined value less than the first predefined value. The second predefined value is less than a critical value beyond which the chip 12 would be damaged. For example, the second predefined value is about 10 grams-force.

Preferably, in order to precisely control the intensity of the compressive force F2, on detection of the position when the chip 12 comes into contact with the mass 16, the means 44 also control activation of the means forming counterweight of the holding means 24. By activating the means forming counterweight and adjusting the value of the intensity of the second force using adjustment means 40, the initial value can be adjusted to a substantially zero value.

The intensity of the second force F2 is then increased from the initial substantially zero value, set on detection of the contact position, up to the second predefined value.

Preferably, the intensity of the second compressive force F2 is increased in incrementation steps from the value of the intensity up to the second predefined value.

During the step when force F2 is applied, the holding means 24 descend to a position P2 where the cylinder rods 38 are extended by a length l2 required to reach the second predefined value of the intensity of the compressive force F2.

Figure 7:
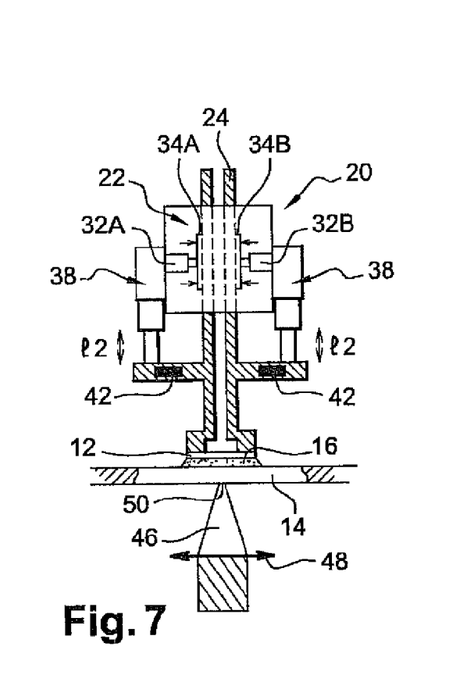

After performing the arranging steps, the method also comprises a step for heating the mass forming solder 16 illustrated on FIG. 7.

To heat the mass forming solder 16, therefore, the laser beam 46 is directed on the first side S1 of the holder 14. More precisely, the laser beam 46 is directed at the position of the mass forming solder 16 during a period of irradiation of the holder 14 by the beam 46.

The heat generated at the point 50 of irradiation of the holder 14 by the laser beam 46 propagates through the holder 14 to the mass forming solder 16 and the chip 12.

Since the surface irregularities were attenuated during the steps when the compressive forces F1 and F2 were applied, the heat transfer is relatively good between the holder 14 and the mass 16 as well as between the mass 16 and the chip 12.

During the heating step, in this example, the relative position of the chip 12 and the holder 14 is maintained constant, at least during the period of irradiation of the holder by the beam 46.

Before the heating step, therefore, the holding means 24 are blocked in position P2. In particular, the control means 44 deactivate the compression means 36 while maintaining the cylinder rods 38 extended by a length l2 and the clamping jaws 34 are activated.

Before the heating step, the mass 16 is relatively hard. The force F2 of intensity equal to the second predefined value is compensated, traditionally, by the reaction of the mass 16 and of the chip 12 on the holding means 24 of intensity also equal to that of the force F2.

During the heating step, the holding means 24 are maintained in position P2. Due to the softening of the mass 16, the intensity of the reaction of the mass 16 and of the chip 12 on the holding means 24 decreases down to zero when the mass 16 is liquid. Since the compression means 36 are deactivated, the intensity of the force F2 exerted by the holding means 24 on the chip 12 and the mass 16 decreases in the same way.

This is carried out in particular to take into account the softening of the mass 16 during the heating step and thereby prevent damage to the chip 12. Applying a compressive force of excessive intensity on the chip 12 and the softened mass 16 during the heating step could project the softened mass 16 on the sides of the chips 12 and thereby compress the chip 12 directly on the holder 14.

Preferably, the relative position of the chip 12 and the holder 14 is maintained constant until the mass forming solder 16 has cooled.

In addition, during irradiation of the holder 14 by the laser beam 46 and cooling of the mass 16, the temperature of the chip 12, in particular, can be checked using the measurement means 52. The optical fibre 54 collects the infrared flux emitted by the chip 12 and transmits it to the pyrometer 56. The pyrometer 56 then converts the luminous flux collected into a temperature value.

Figure 8:
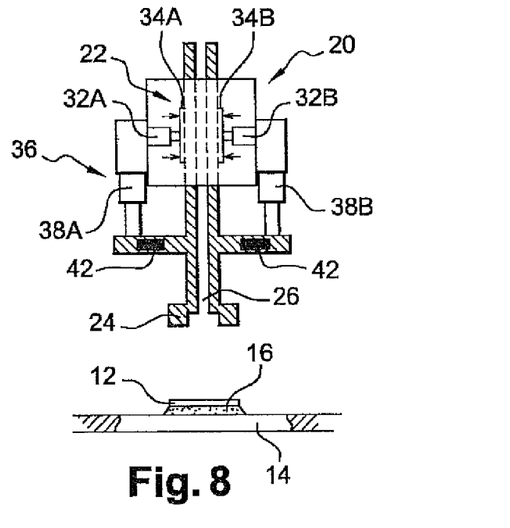

After the mass 16 has cooled, as illustrated on FIG. 8, the suction means 28 are deactivated and the holding means 24 release the chip 12. The connection means 30 are deactivated and the jaws 34 release the holding means 24. The cylinder rods 38 are retracted, allowing the holding means 24 to rise. The connection means 30 are then activated again and the articulated means 22 can move the holding means 24, for example to arrange and solder a new element on the holder 14.

The invention claimed is:

1. A method of soldering a component to a holder by addition of a mass forming solder, of the type comprising a step in which the mass is heated, characterised in that, before the heating step, it comprises the following steps of arranging the mass and the component on the holder:
    positioning the mass on the holder;
    applying a first compressive force on the mass so as to compress the mass against the holder and attenuate surface irregularities of the mass, an intensity of the first compressive force increasing up to a predefined first value chosen so as to flatten the mass;
    positioning the component on the flattened mass; and
    applying a second compressive force to the component so as to compress the component against the flattened mass and the holder, an intensity of the second force increasing up to a second predefined value, the second predefined value being less than the first predefined value,
    wherein the intensity of the first compressive force and/or the second compressive force is increased in incrementation steps from the value of the intensity up to the first and/or the second predefined value, respectively.

2. The method according to claim 1, wherein
    during the step of positioning the mass on the holder, the mass is moved towards the holder until detection of a position where the mass comes into contact with the holder, and
    during the application step, the intensity of the first compressive force is increased from a substantially zero initial value set during detection of the contact position up to the first predefined value.

3. The method according to claim 1, wherein
    during the step of positioning the component on the flattened mass, the component is moved towards the flattened mass until detection of a position where the component comes into contact with the flattened mass, and
    during the application step, the intensity of the second compressive force is increased from a substantially zero initial value set during detection of the contact position up to the second predefined value.

4. The method according to claim 1, wherein, during the heating step, the relative position of the component and the holder is maintained constant.

5. The method according to claim 1, wherein, during the heating step, a laser beam is directed to a first side of the holder opposite a second side of the holder bearing the mass, at the position of the mass, during a period of irradiation of the holder by the beam, and the relative position of the component and the holder is maintained constant.

6. The method according to claim 1, wherein the first predefined value is determined according to a lower critical limit of the mass thickness after the step when the first compressive force is applied.

7. The method according to claim 1, wherein the second predefined value is less than a critical value beyond which the component would be damaged.

8. The method according to claim 1, wherein the component is a semi-conductor chip.

9. A device for arranging a first element on a second element comprising:
- a displacement means that moves the first element on the second element;
- means for compressing the first element against the second element so as to attenuate surface irregularities of the first element;
- means for detecting a contact position when the first element comes into contact with the second element;
- means forming counterweight of the displacement means; and
- means for controlling the compression means and the means forming counterweight according to detection of the contact position, wherein the displacement means comprises:
- a suction type holding means to hold the first element, and
- an infrared type temperature measurement means with an optical fibre passing through a suction tube of the holding means.

10. The device according to claim 9, wherein the detection means are chosen amongst a capacitive type contact detector and a pressure detector.

11. The device according to claim 9, designed to arrange a first element chosen amongst a mass forming solder and a semi-conductor chip on a second element forming holder.

* * * * *

UNITED STATES PATENT AND TRADEMARK OFFICE
CERTIFICATE OF CORRECTION

| | | |
|---|---|---|
| PATENT NO. | : 8,952,288 B2 | Page 1 of 1 |
| APPLICATION NO. | : 13/672400 | |
| DATED | : February 10, 2015 | |
| INVENTOR(S) | : Morelle et al. | |

It is certified that error appears in the above-identified patent and that said Letters Patent is hereby corrected as shown below:

On the title page item [73], insert --Valeo Equipements Electriques Moteur, Créteil (FR)--

Signed and Sealed this
Thirtieth Day of June, 2015

Michelle K. Lee
*Director of the United States Patent and Trademark Office*

UNITED STATES PATENT AND TRADEMARK OFFICE
CERTIFICATE OF CORRECTION

PATENT NO. : 8,952,288 B2  
APPLICATION NO. : 13/672400  
DATED : February 10, 2015  
INVENTOR(S) : Morelle et al.

Page 1 of 1

It is certified that error appears in the above-identified patent and that said Letters Patent is hereby corrected as shown below:

On the title page item [73], should read --Valeo Equipements Electriques Moteur, Créteil (FR)--

This certificate supersedes the Certificate of Correction issued June 30, 2015.

Signed and Sealed this  
Fourth Day of August, 2015

Michelle K. Lee  
*Director of the United States Patent and Trademark Office*